United States Patent

Sanada et al.

[11] Patent Number: 5,976,620
[45] Date of Patent: Nov. 2, 1999

[54] COATING SOLUTION APPLYING METHOD AND APPARATUS

[75] Inventors: Masakazu Sanada; Minobu Matsunaga, both of Kyoto, Japan

[73] Assignee: Dainippon Screen Mfg. Co., Ltd., Japan

[21] Appl. No.: 08/969,273

[22] Filed: Nov. 13, 1997

[30] Foreign Application Priority Data

Nov. 20, 1996 [JP] Japan .................................. 8-308802

[51] Int. Cl.⁶ ........................................................ B05D 3/12
[52] U.S. Cl. ........................ 427/240; 427/385.5; 437/231
[58] Field of Search ................................ 427/240, 385.5; 118/52; 437/231

[56] References Cited

U.S. PATENT DOCUMENTS

| | | | |
|---|---|---|---|
| 5,405,813 | 4/1995 | Rodrigues | 427/240 |
| 5,677,001 | 10/1997 | Wang et al. | 427/240 |
| 5,773,082 | 6/1998 | Ku et al. | 427/240 |
| 5,780,105 | 7/1998 | Wang | 427/240 |

*Primary Examiner*—Janyce Bell
*Attorney, Agent, or Firm*—Ostrolenk, Faber, Gerb & Soffen, LLP

[57] ABSTRACT

A method of applying a coating solution for forming a coating film of desired thickness. The coating solution begins to be supplied to a region centrally of a substrate. The spinning substrate is accelerated from a supplying rotational frequency to a higher, target rotational frequency before the coating solution is spread by the supplying rotational frequency to cover an entire surface of the substrate. Then, the supply of the coating solution is stopped. Subsequently, the substrate is spun with a film-forming rotational frequency lower than the target rotational frequency to form the coating film. The substrate is spun at high speed with the target rotational frequency for a variable period of time to adjust thickness of the coating film.

16 Claims, 7 Drawing Sheets

COATING SOLUTION APPLYING METHOD AND APPARATUS

BACKGROUND OF THE INVENTION (1) Field of the Invention

This invention relates to methods and apparatus for applying a coating solution such as SOG (Spin On Glass, also called a silica coating material), photoresist or polyimide resin to substrates such as semiconductor wafers, glass substrates for photomasks, glass substrates for liquid crystal displays or glass substrates for optical disks (hereinafter referred to simply as substrates or as wafers). More particularly, the invention relates to a technique of supplying a coating solution to the surface of each substrate to form a coating film in a desired thickness thereon.

(2) Description of the Related Art

A conventional coating solution applying method of the type noted above will be described with reference to FIG. 1. FIG. 1 shows a principal portion of a substrate spin coating apparatus.

The illustrated apparatus includes a suction type spin chuck 10 for suction-supporting and spinning a substrate or wafer W in a substantially horizontal posture, and a supply nozzle 30 disposed substantially over the center of spin for supplying a photoresist solution R, which is a coating solution, to a surface of wafer W.

In a conventional coating solution applying method utilizing the apparatus with the above construction, rotational frequency controls are carried out as shown in the time chart of FIG. 2, for example, to form a photoresist film in a desired thickness on the surface of wafer W.

First, the spin chuck 10 is driven by a motor, not shown, to spin the wafer W at a predetermined rotational frequency R1 (e.g. 900 rpm). At a point of time $t_S$ at which the spin stabilizes, photoresist solution R begins to be delivered at a substantially constant flow rate from the supply nozzle 30. Photoresist solution R continues to be supplied to a region around the spin center of wafer W. The supply of photoresist solution R is stopped at a point of time $t_E$ which is a predetermined time after the photoresist supply starting point $t_S$. A quantity of photoresist solution R supplied is determined such that substantially the entire surface of wafer W is covered by the photoresist solution R at the supply stopping point of time $t_E$. Then, the rotational frequency of the spin chuck 10 is increased from rotational frequency R1 to rotational frequency R2 (e.g. 3,000 rpm). This higher rotational frequency R2 is maintained for a predetermined time. Consequently, a superfluous part of photoresist solution R supplied to the surface of wafer W is dispelled, thereby forming a photoresist film in a desired thickness on the surface of wafer W.

In order to adjust the thickness of the photoresist film, as shown in dotted lines in FIG. 2, the rotational frequency R2 may be decreased to form a thick film, or may be increased to form a thin film. The above photoresist solution supplying method in which the photoresist solution supply is started and stopped while the wafer W is spinning is called "dynamic method" in this specification.

On the other hand, a supplying method different from the dynamic method may be employed in which, as shown in parentheses in FIG. 2, the photoresist solution supply is started at a point of time ($t_S$) when the wafer W is stationary, and stopped after rotation of the wafer W begins. This supplying method is a combination of the above dynamic method and a supplying method (hereinafter called static method) in which the photoresist solution supply is started and stopped while the wafer W is maintained stationary. Thus, this supplying method will be called "stamic method" in this specification.

The conventional photoresist solution applying method noted above has the drawbacks set forth hereunder. While these drawbacks will be described, taking the "dynamic method" for example, they are equally applicable to the "stamic method".

After supply of the photoresist solution R is started at the point of time $t_S$ in FIG. 2, the photoresist solution R supplied to a region around the center of wafer W, while retaining a substantially circular shape in plan view, spreads concentrically under the centrifugal force due to the rotational frequency R1. Subsequently, however, the photoresist solution R supplied to the region around the center of wafer W does not spread evenly in radial directions. Instead, as shown in FIG. 3, from a circular drop Ra (hereinafter referred to as core Ra) of photoresist solution R present around the spin center of wafer W, the photoresist solution R begins to flow in a plurality of rivulets (hereinafter referred to as fingers Rb) extending radially toward the edge of wafer W.

As the photoresist solution continues to be supplied in this state, the fingers Rb first extend and reach the edge of wafer W. With a further supply of photoresist solution, the fingers Rb become broader while the core Ra increases in diameter. As a result, uncovered regions between the fingers Rb become filled with the photoresist solution R, until finally the entire surface of wafer W is covered by the photoresist solution R.

In the stage of rotational frequency R1, the entire surface of wafer W is covered by the photoresist solution R exhibiting the foregoing behavior. After the fingers Rb reach the edge of wafer W, a large part of the photoresist solution R on the wafer W flows through the fingers Rb to scatter to the ambient. In order to cover the entire surface of wafer W, it is necessary to take into account the quantity of photoresist solution R scattering to the ambient after flowing through the fingers Rb, and to supply the photoresist solution R in a correspondingly increased quantity. If the photoresist solution R were supplied in an insufficient quantity, the uncovered regions between the fingers Rb would not be filled with the photoresist solution R. Even if the rotational frequency of wafer W is switched to the rotational frequency R2, it is impossible to form a photoresist film of uniform thickness.

Thus, according to the conventional coating solution applying method, a large quantity of photoresist solution R must be supplied in order to form a photoresist film of uniform thickness on the wafer W. This poses a problem of a very low efficiency of using the photoresist solution R. The photoresist solution is far more expensive than a treating solution such as a developer or a rinse used in manufacture of semiconductor devices. Thus, to improve the efficiency of using the photoresist solution through a reduction in the quantity of scattering photoresist solution is an important consideration in achieving low manufacturing costs of semiconductor devices and the like.

In addition, there has been a trend recently to use larger semiconductor wafers in the manufacture of semiconductor devices. It is urgently required to achieve a technical objective of forming photoresist films of highly uniform thickness while cutting down the consumption of photoresist solution as much as possible. Attempts are being made today to adopt large wafers 300 mm in diameter rather than 8-inch (about 200 mm) wafers, for example. Processing of wafers having such a large diameter encounters the following inconvenience besides that noted above.

When a large wafer of 300 mm diameter is processed under the rotational frequency controls according to the time chart shown in FIG. 2, a photoresist film formed on the wafer surface has a drastically reduced uniformity in thickness. When a photoresist film is formed on the wafer W in a spin, turbulent gas flows are generated adjacent the edge of the wafer W. These gas flows are more conspicuous for large diameter wafers. The turbulence results in an uneven vaporization of solvent occurring with the photoresist solution spreading from the center to the edge of the wafer W. This phenomenon is believed to be the main cause of the drastically reduced uniformity in film thickness.

The rotational frequency of the wafer W must be lowered in order to suppress the turbulent gas flows to secure a uniform film thickness. Taking the foregoing controls for example, the rotational frequency R1 should be lowered from the conventional 900 rpm to 700 rpm, and the rotational frequency R2 from the conventional 3,000 rpm to 1,500 rpm. By lowering the rotational frequencies R1 and R2 to the stated levels, turbulent flows may be suppressed to improve the uniformity in film thickness. However, naturally, the photoresist solution will be dispelled from the wafer W in a reduced quantity, resulting in an increased thickness of photoresist film formed thereon. Thus, it is difficult to form a photoresist film of desired thickness, especially a thin photoresist film.

To obtain a photoresist film of desired thickness with a high degree of uniformity in film thickness, it has been proposed to adjust the viscosity (e.g. in units of 0.1 cp) of the photoresist solution according to a desired film thickness. That is, a thin film may be formed by supplying a photoresist solution of low viscosity. With such a technique, however, there is a limitation to the adjustable range of film thickness. After all, film thickness must be adjusted by varying the levels of rotational frequencies R1 and R2. However, in the case of a large wafer, the problem of non-uniform film thickness due to turbulent gas flows inhibits major adjustments to be made to the rotational frequencies R1 and R2 over the ranges that were possible in the past. Consequently, only a small range is allowed for adjusting the thickness of photoresist film while securing a high level of uniformity in film thickness.

The proposed technique of adjusting film thickness by varying the viscosity of the photoresist solution can hardly be said a realistic method of processing large wafers. The reason is that a solvent mixing mechanism is required for mixing a photoresist solution of fixed viscosity with a solvent in a quantity corresponding to a desired film thickness, or a photoresist solution switching mechanism for selecting a photoresist solution from photoresist solutions of varied viscosity levels prepared in advance, to be supplied according to a film thickness needed. In any case, the apparatus and its controls will be extremely complicated.

SUMMARY OF THE INVENTION

This invention has been made having regard to the state of the art noted above, and its object is to provide a coating solution applying method and apparatus incorporating improved rotational frequency controls to promote use efficiency of a coating solution, and enabling adjustment of a high-speed spinning time after the coating solution is supplied, to adjust film thickness over an extended range while maintaining a high degree of uniformity in film thickness even for large substrates.

The above object is fulfilled, according to this invention, by a method of applying a coating solution to a surface of a substrate to form a coating film of desired thickness thereon, comprising the steps of:

(a) starting supply of the coating solution to a region centrally of the substrate maintained still or spun at low speed with a supplying rotational frequency;

(b) accelerating the substrate to a target rotational frequency higher than the supplying rotational frequency before the coating solution is spread by the supplying rotational frequency to cover an entire surface of the substrate;

(c) stopping the supply of the coating solution to the substrate; and (d) spinning the substrate with a film-forming rotational frequency lower than the target rotational frequency to form the coating film;

wherein the substrate is spun at high speed with the target rotational frequency for a variable period of time to adjust thickness of the coating film.

The coating solution begins to be supplied to a region centrally of the substrate maintained still or spun at low speed with a supplying rotational frequency (step (a)). Then, the coating solution supplied is spread by the supplying rotational frequency from the central region to the edge of the substrate. In the course of this event, a plurality of rivulets (i.e. fingers) develop from a circular drop (i.e. core) of the coating solution present around the center of the substrate, and begin to extend toward the edge of the substrate. When the numerous fingers reach the edge of the substrate, the coating solution flows from the core through the fingers to scatter to the ambient without being used. Therefore, the substrate is accelerated from the lower, supplying rotational frequency to the higher, target rotational frequency before the coating solution covers the entire surface of the substrate (step (b)).

Then, as schematically shown in FIG. 6, a force of inertia is applied to the fingers Rb which would otherwise extend linearly from the core Ra adjacent the center of the substrate toward the edge of the substrate (two-dot-and-dash lines). The resultant of centrifugal force and inertia bends the fingers Rb circumferentially, thereby enlarging widths thereof. The diameter of core Ra also increases as the leading ends of the fingers Rb extend toward the edge (dotted lines). The uncovered regions between the fingers Rb diminish rapidly, to shorten the time taken for the coating solution to cover the entire surface of the substrate. With the shortened coating time, a reduced quantity of the coating solution scatters to the ambient through the fingers Rb. As a result, the use efficiency of the coating solution is improved to realize reduced manufacturing costs of semiconductor devices.

The supply of the coating solution is stopped after the substrate begins to be accelerated from the supplying rotational frequency to the target rotational frequency (step (c)). The substrate is spun at the film-forming rotational frequency for a predetermined time to dry the coating solution spread over the entire surface of the substrate, thereby to form the coating film (step (d)). At these steps, as the substrate continues to be spun at high speed with the target rotational frequency, turbulent gas flows are generated shortly, which would cause a non-uniform film thickness. However, the coating solution supply has already covered substantially the entire surface of the substrate by then. The turbulent gas flows have little influence on the coating solution spreading from the central region to the edge of the substrate. The solvent contained in the solution vaporizes substantially uniformly from the surface of the substrate.

Consequently, the coating solution spreads uniformly substantially over the entire surface of the substrate.

The substrate continues further to be spun at the high, target rotational frequency to spread the coating solution completely over the entire surface of the substrate and to dispel a superfluous part of the coating solution. The quantity of coating solution to be dispelled may be adjusted by adjusting a period of time for maintaining the target rotational frequency without adjusting the target rotational frequency itself. In this way, an adjustment may be made to the thickness of the coating solution covering the entire surface of the substrate.

As a result, the method according to this invention avoids the non-uniformity in film thickness due to turbulent gas flows which tend to be generated by large substrates in particular, and realizes an increased range of film thickness adjustment while retaining a high degree of uniformity in film thickness. A thin coating film may be formed with high quality to cope with semiconductor devices manufactured under stringent design rules. Since the viscosity of the coating solution need not be varied according to film thicknesses, uniform coating films may be formed on large substrates simply by applying this coating solution applying method to existing apparatus. Thus, the existing apparatus may be used in an effective way.

In the method according to this invention, the supply of the coating solution, preferably, is started while the substrate is spun at low speed with the supplying rotational frequency, and stopped after the substrate reaches the target rotational frequency, the substrate continuing to be spun at high speed with the target rotational frequency for an idle spinning time adjustable with reference to a point of time at which the supply is stopped.

With this method (i.e. dynamic method) of supplying the coating solution, in which the coating solution supply is started while spinning the substrate at the supplying rotational frequency, and stopped after the substrate reaches the target rotational frequency, the quantity of coating solution to be dispelled may be lessened, and the coating solution may be spread over the entire surface of the substrate without the influence of turbulent gas flows. In addition, the thickness of the coating solution covering the entire surface of the substrate may be adjusted by adjusting the period of time for spinning the substrate at the target rotational frequency, with reference to the point of time at which the coating solution supply is stopped.

It is also preferred that the coating solution supply is started while the substrate is maintained still, and stopped after the substrate reaches the target rotational frequency, the substrate continuing to be spun at high speed with the target rotational frequency for a time adjustable with reference to a point of time at which the supply is stopped.

With this method (i.e. stamic method) of supplying the coating solution, in which the coating solution supply is started while maintaining the substrate still, and stopped after the substrate reaches the target rotational frequency, the quantity of coating solution to be dispelled may be lessened, and the coating solution may be spread over the entire surface of the substrate without the influence of turbulent gas flows. In addition, the thickness of the coating solution covering the entire surface of the substrate may be adjusted by adjusting the period of time for spinning the substrate at the target rotational frequency, with reference to the point of time at which the coating solution supply is stopped.

In a further aspect of this invention, an apparatus is provided for applying a coating solution to a surface of a substrate to form a coating film of desired thickness thereon. This apparatus comprises:

a rotary support for supporting and spinning the substrate;

a coating solution supplying device for supplying the coating solution to a region centrally of the substrate; and a control device for starting supply of the coating solution through the coating solution supplying device to the substrate maintained still or spun through the rotary support at low speed with a supplying rotational frequency, accelerating the substrate to a target rotational frequency higher than the supplying rotational frequency before the coating solution is spread by the supplying rotational frequency to cover an entire surface of the substrate, spinning the substrate with a film-forming rotational frequency lower than the target rotational frequency, after stopping the supply of the coating solution, to form the coating film, and adjusting a period of time for spinning the substrate at high speed with the target rotational frequency, to adjust thickness of the coating film.

The control device spins the substrate through the rotary support, and accelerates the substrate spin to the target rotational frequency higher than the supplying rotational frequency before the coating solution supplied is spread by the supplying rotational frequency to cover the entire surface of the substrate. This achieves a shortened time taken for the coating solution to cover the entire surface of the substrate, and a reduced quantity of the coating solution scattering to the ambient. As a result, the use efficiency of the coating solution is improved to realize reduced manufacturing costs of semiconductor devices.

After stopping the coating solution supply, the substrate is spun at the film-forming rotational frequency lower than the target rotational frequency to spread the coating solution completely over the entire surface of the substrate and to dispel a superfluous part of the coating solution. The quantity of coating solution to be dispelled may be adjusted by adjusting a period of time for maintaining the target rotational frequency without adjusting the target rotational frequency itself. In this way, an adjustment is made to the thickness of the coating solution covering the entire surface of the substrate.

As a result, this apparatus can avoid the non-uniformity in film thickness due to turbulent gas flows, and realize an increased range of film thickness adjustment while retaining a high degree of uniformity in film thickness. A thin coating film may be formed with high quality to cope with semiconductor devices manufactured under stringent design rules.

BRIEF DESCRIPTION OF THE DRAWINGS

For the purpose of illustrating the invention, there are shown in the drawings several forms which are presently preferred, it being understood, however, that the invention is not limited to the precise arrangement and instrumentalities shown.

DESCRIPTION OF THE PREFERRED EMBODIMENTS

Preferred embodiments of the present invention will be described in detail hereinafter with reference to the drawings.

Figure 1:
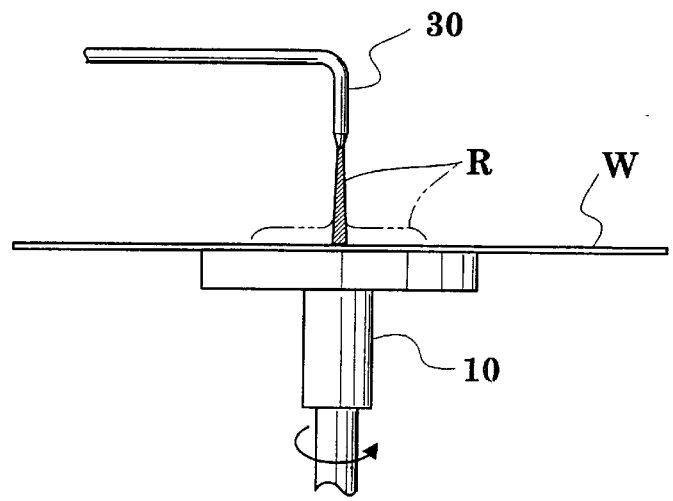
FIG. 1 is a view showing a principal portion of a conventional substrate spin coating apparatus.
Figure 2:
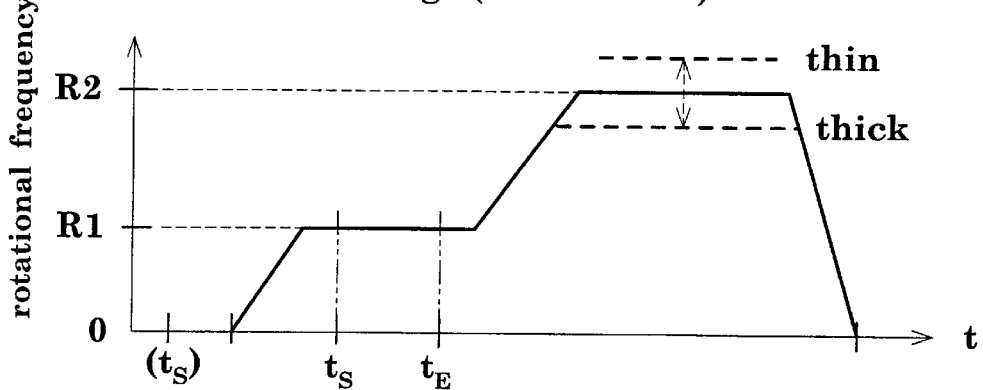
FIG. 2 is a time chart showing a conventional coating solution applying method.
Figure 3:
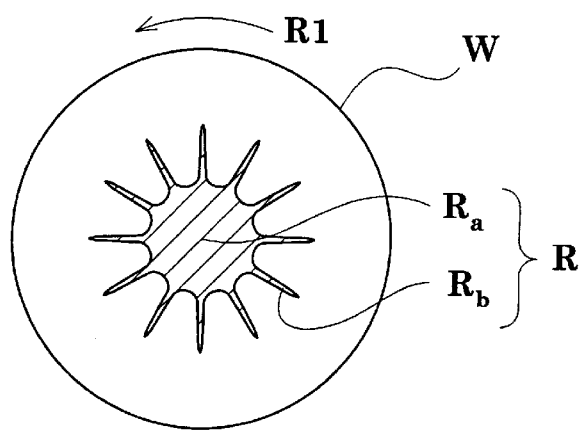
FIG. 3 is an explanatory view illustrating the conventional coating solution applying method.
Figure 4:
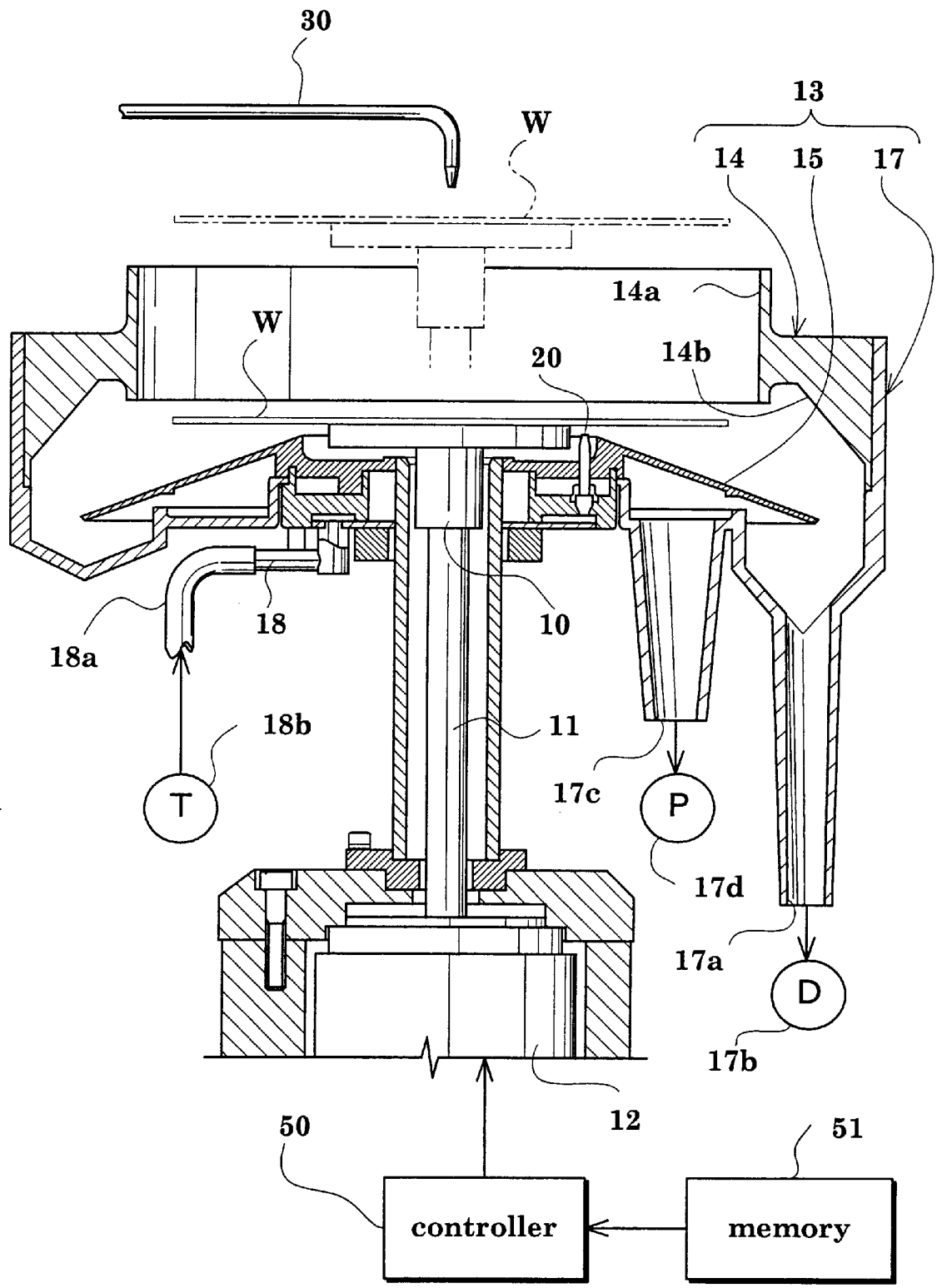
FIG. 4 is a view showing an outline of a substrate spin coating apparatus according to the present invention.

FIG. 4 is a view in vertical section of a substrate spin coating apparatus employing a coating solution applying method according to the present invention.

Reference numeral 10 in FIG. 4 denotes a suction type spin chuck for suction-supporting a substrate or wafer W in a substantially horizontal posture. This spin chuck 10 is attached to a hollow rotary shaft 11 to be rotatable by a motor 12. The spin chuck 10 is surrounded by a scatter prevention cup 13 for preventing a coating solution, such as a photoresist solution, and the like from scattering from the wafer W to the ambient space. When a transport device (not shown) places an untreated wafer W on the spin chuck 10 or removes a treated wafer W from the spin chuck 10, a lift device (not shown) vertically moves the rotary shaft 11 and scatter prevention cup 13 relative to each other, whereby the spin chuck 10 is raised above the scatter prevention cup 13 (as shown in two-dot-and-dash lines in FIG. 4).

The scatter prevention cup 13 includes an upper cup 14, a baffle disk 15 and a lower cup 17. The upper cup 14 defines an upper opening 14a, and a slant surface 14b for downwardly guiding sprays of photoresist solution or the like produced when the wafer W is rotated.

The baffle disk 15 straightens and downwardly guides air flows entering through the opening 14a and descending round the edge of wafer W. The sprays of the photoresist solution or the like guided downward by the slant surface 14b of upper cup 14 are entrained by these air flows to enter the lower cup 17.

The lower cup 17 has a liquid outlet 17a formed in a bottom thereof. The liquid outlet 17a is connected to a drain tank 17b for collecting the photoresist solution and the like scattered by a spin of wafer W. Further, a cup vent 17c is formed in the bottom of lower cup 17. The cup vent 17c is connected to an exhaust pump 17d to draw mist of the photoresist solution and the like along with air from inside the scatter prevention cup 13.

Back rinse nozzles 20 are arranged inside the baffle disk 15 for delivering a cleaning solution toward the back side surface of wafer W to remove the part of the photoresist solution flowing round to the back side surface and the mist adhering thereto. The back rinse nozzles 20 receive the cleaning solution from a cleaning solution source 18b through a tube fitting 18 and a supply pipe 18a.

A supply nozzle (coating solution supplying device) 30 is disposed above the opening 14a of scatter prevention cup 13 and substantially over the spin center of wafer W for delivering the photoresist solution. A supply mechanism, not shown, for supplying the photoresist solution in a predetermined quantity to the nozzle 30, the lift device, not shown, for vertically moving the spin chuck 10 and scatter prevention cup 13 relative to each other, and the motor 12, are controlled by a controller 50. This controller 50 controls the above components based on a processing program stored in a memory 51 and incorporating time charts described hereinafter.

Rotational frequency controls based on a method according to this invention and applied to the substrate spin coating apparatus having the above construction will be described next with reference to the time chart of FIG. 5.

Though omitted from the time chart described hereinafter, it is preferable to add a command to deliver the cleaning solution from the back rinse nozzles 20 in order to remove the photoresist solution and mist thereof from the back side surface of wafer W. This time chart employs the supplying method ("dynamic method") in which the supply of the photoresist solution is started and stopped while the wafer W is spinning.

First, with the wafer W suction-supported by the spin chuck 10, the controller 50 starts and controls the motor 12 to spin the wafer W at a rate reaching a rotational frequency R3 at a point in time $t_1$. This rotational frequency R3 corresponds to the supplying rotational frequency of this invention, which is 1,500 rpm, for example. At a point in time $t_S$, after the rotation of wafer W stabilizes at the supplying rotational frequency R3, the photoresist solution begins to be supplied at a fixed flow rate through the supply nozzle 30. For a while, the photoresist solution supplied is present around the spin center of wafer W in the form of a circular drop (or core). Subsequently, the photoresist solution begins to flow in a plurality of rivulets (i.e. fingers) from the edge of the core. These numerous fingers continue to extend linearly toward the edge of wafer W along with an increase in the diameter of the core. When the numerous fingers reach the edge of wafer W, the photoresist solution flows through the fingers to scatter to the ambient environment without being used. The above point of time $t_S$ corresponds to step (a) of this invention.

In this way, the photoresist solution supplied adjacent the spin center of wafer W spreads toward the edge thereof under the centrifugal force resulting from the rotational frequency R3. Before the entire surface of wafer W is covered by the photoresist solution, the spin of wafer W is accelerated from the supplying rotational frequency R3 to a higher rotational frequency R4. Specifically, the rotational frequency of motor 12 is increased at a point of time $t_2$ to reach the rotational frequency R4 at a point of time $t_3$. This rotational frequency R4 corresponds to the target rotational frequency of this invention, which is 4,000 rpm, for example. The stage from point in time $t_2$ to point in time $t_3$ corresponds to step (b) of this invention.

Figure 6:
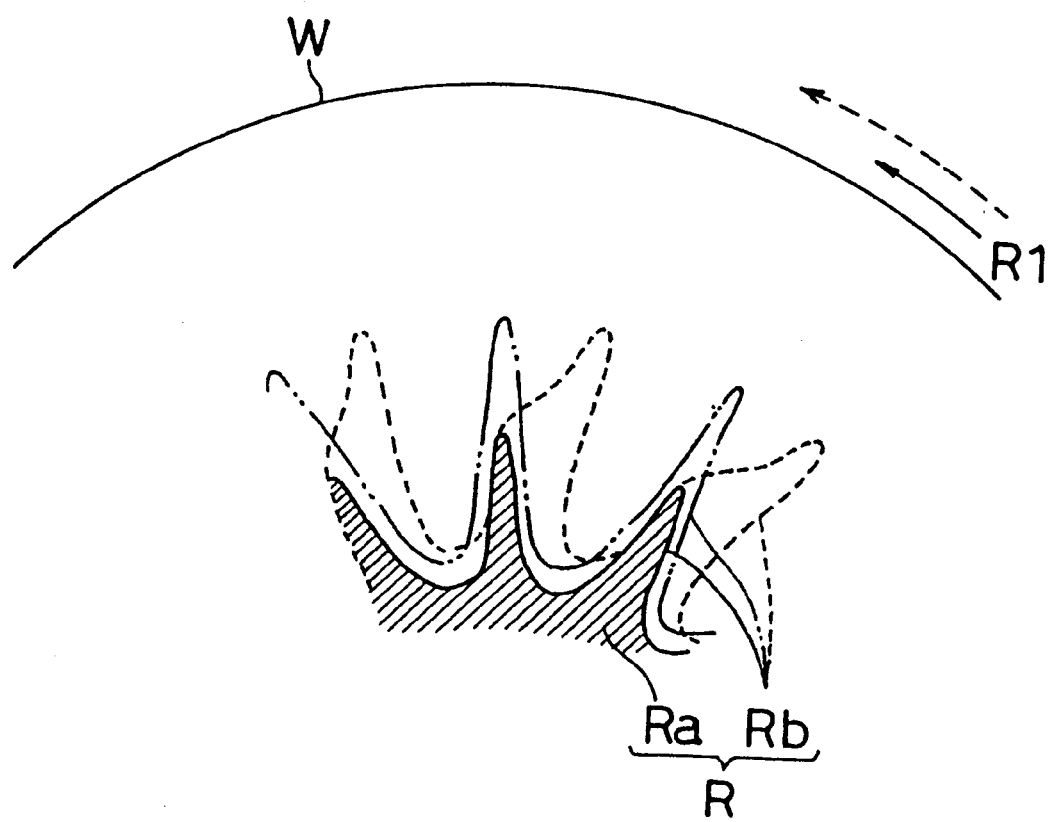
FIG. 6 is a schematic view showing a behavior of a photoresist solution.

The photoresist solution spreading on the surface of wafer W with the above acceleration exhibits a behavior as shown in FIG. 6. A force of inertia due to the acceleration for increasing the rotational frequency and a centrifugal force due to the high-speed spin act on the fingers Rb which would otherwise extend linearly toward the edge of wafer W as shown in two-dot-and-dash lines. The resultant of centrifugal force and inertia bends the fingers Rb circumferentially, thereby enlarging the widths of the finger, as shown in dotted lines in FIG. 6. In addition, the diameter of core Ra increases. Since the fingers Rb are bent circumferentially, the core Ra and fingers Rb grow and spread in unison toward the edge of wafer W. Thus, the time taken for the photoresist solution to cover the entire surface of wafer W is shorter than in the prior art. With the shortened coating time, a reduced quantity of the photoresist solution scatters to the ambient environment through the fingers Rb. That is, the efficiency at which the photoresist solution is used is improved.

The photoresist solution supply through the supply nozzle 30 is stopped upon lapse of a supply continuance time $T_{H0}$ from the point of time $t_3$ at which the high-speed rotational frequency R4 is reached, that is at a point in time $t_E$ when a predetermined supplying time $T_{SU}$ elapses after the point in time $t_S$ at which the photoresist solution supply is started. When the spin of wafer W reaches the high-speed rotational frequency R4, turbulent gas flows are generated from the edge of wafer W with a slight delay, which develop gradually toward the center of wafer W. These turbulent flows cause a non-uniform vaporization of the solvent from the photoresist solution spreading from the spin center toward the edge of wafer W. This constitutes the main cause of non-uniformity in the thickness of photoresist film. However, the photoresist solution supply has already been stopped and substantially the entire surface of wafer W has been covered by the photoresist solution at the point of time $t_E$ when the supply continuance time $T_{H0}$ elapses from the point of time $t_3$ at which the high-speed rotational frequency R4 is reached. Consequently, the non-uniform vaporization of the solvent is avoided when the photoresist solution spreads over the entire surface of wafer W.

The above supply continuance time $T_{H0}$ preferably is determined from various conditions such as the size of wafer W, rotational frequency R4, and flow rate of the photoresist solution supplied, and should preferably be set to or immediately after a point of time when the turbulent gas flows are generated by the rotational frequency R4. The above point of time $t_E$ corresponds to step (c) of this invention.

After the photoresist solution has spread uniformly substantially over the entire surface of wafer W as noted above, the high-speed rotational frequency R4 is maintained for a period of time corresponding to a desired film thickness. Specifically, a period of time (hereafter called idle spinning time $T_H$) for spinning the wafer W at the rotational frequency R4 after the point of time $t_E$ for stopping the photoresist solution supply, i.e. the period from point of time $t_E$ to point of time $t_4$, may be determined according to a desired film thickness. During the idle spinning time $T_H$, the photoresist solution spreads completely over the entire surface of wafer W, and a small superfluous part of the solution is dispelled to achieve a rough adjustment approximate to the desired film thickness. The high-speed rotational frequency R4 maintained induces the influence of turbulent gas flows. However, the drawback of causing a non-uniform film thickness does not occur since the photoresist solution already covers the entire surface of wafer W.

Upon lapse of the idle spinning time $T_H$, the motor 12 is controlled for the spin of wafer W to reach a rotational frequency R5, at a point in time $t_5$, which is lower than the high-speed rotational frequency R4. The turbulent flows caused by the high-speed rotational frequency R4 may substantially be suppressed by lowering the rotational frequency to the rotational frequency R5. This rotational frequency R5 is maintained until a point of time $t_6$, to dry the photoresist solution formed substantially in the desired film thickness over the entire surface of wafer W. As a result, a photoresist film of desired thickness is formed. The above rotational frequency R5 corresponds to the film-forming rotational frequency of this invention, which is 3,000 rpm, for example. The stage from point of time $t_5$ to point of time $t_6$ corresponds to step (d) of this invention.

As described above, the wafer W is spun at the high-speed rotational frequency R4, and the photoresist solution supply is stopped, with the photoresist solution covering substantially the entire surface of wafer W, by the time turbulent gas flows are generated. This control can avoid a non-uniform film thickness due to a non-uniform vaporization of the solvent occurring under the influence of turbulent gas flows. Consequently, a photoresist film of highly uniform thickness may be formed over the entire surface of wafer W.

Figure 5:
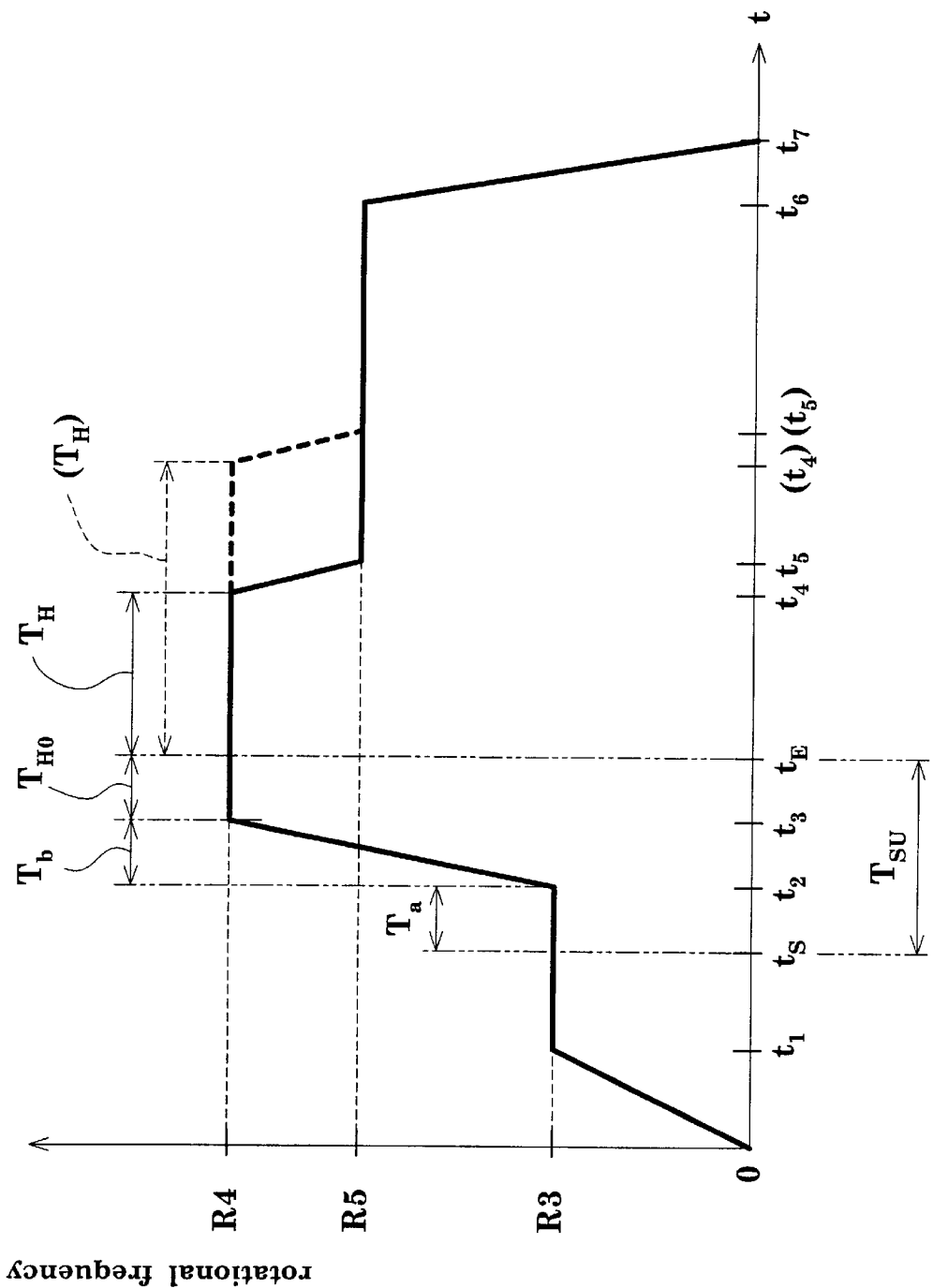
FIG. 5 is a time chart showing a photoresist applying method (dynamic method) according to the present invention.

To adjust the film thickness, the idle spinning time $T_H$ may be varied as shown in parentheses in FIG. 5. That is, the idle spinning time $T_H$ is varied to dispel the photoresist solution in a varied quantity, thereby to vary the thickness of the photoresist solution covering the entire surface of wafer W. Since the thickness of photoresist film is variable without changing the rotational frequency, the non-uniform film thickness due to turbulent gas flows may be avoided for large wafers W as well. Thus, film thickness may be adjusted over a larger range than in the prior art. Particularly where a thin film is required, the conventional technique, generally, must increase rotational frequency. In the method according to this invention, a thin film of high quality may be formed by extending the idle spinning time $T_H$ without changing rotational frequency. Further, with this method, a photoresist solution with a single viscosity level can form photoresist films of various thicknesses. Thus, this method is readily applicable to existing apparatus, and does not require a complicated construction or control which is the case with the method proposed heretofore for varying film thickness by adjusting the viscosity of photoresist solution.

Next, results of measurement of film thickness ranges will be described with reference to the graphs shown in FIGS. 7 and 8. These ranges were adjusted by varying the idle spinning time $T_H$ in the rotational frequency controls shown in the time chart of FIG. 5. The samples used were 8-inch wafers.

Figure 7:
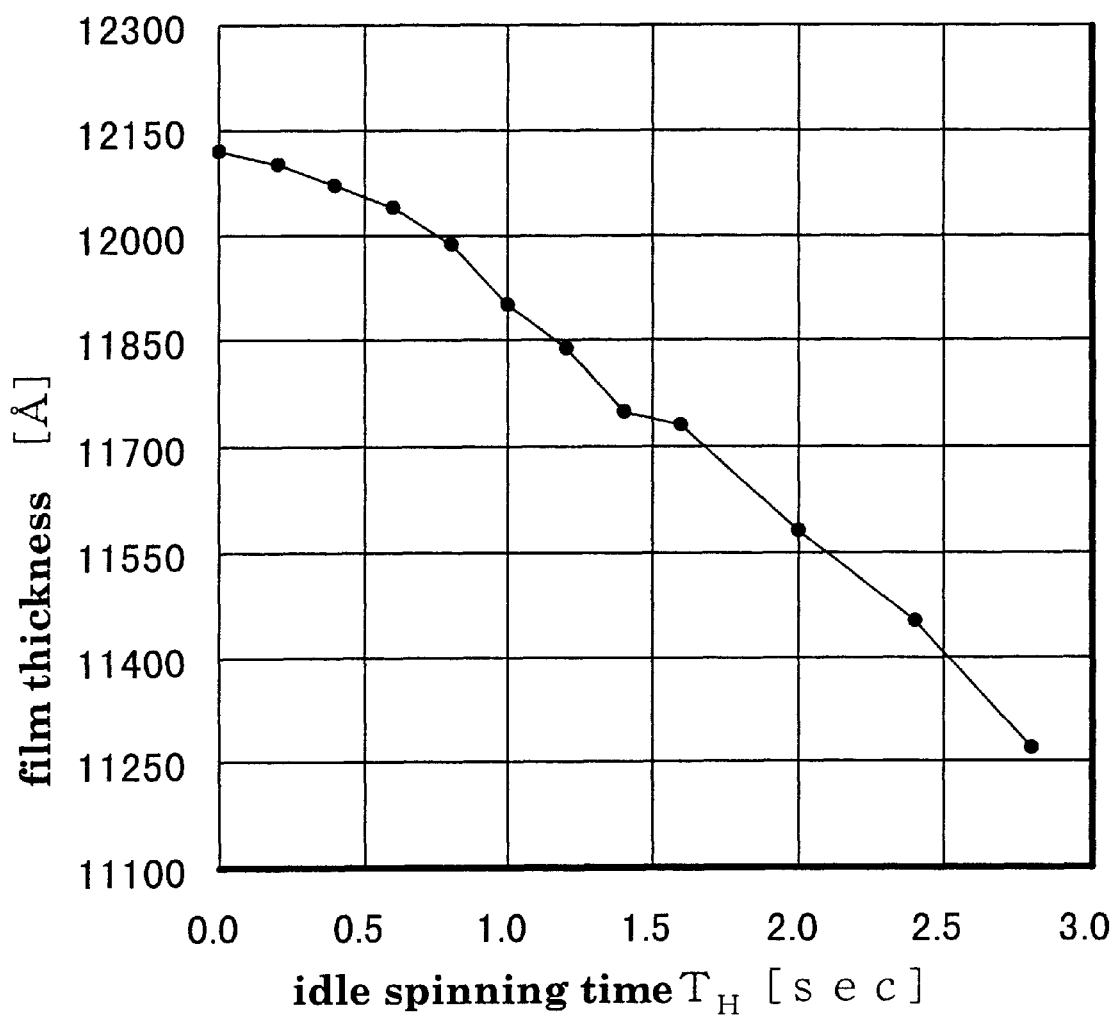
FIG. 7 is a graph showing an example of film thickness ranges resulting from variations in idle spinning time.

FIG. 7 shows measurements obtained where the (supplying) rotational frequency R3 was 1,500 rpm, (target) rotational frequency R4 was 4,000 prm, and (film-forming) rotational frequency R5 was 3,000 rpm. Further, the supply continuance time $T_{H0}$ was 0.4 sec., and the idle spinning time $T_H$ was varied in appropriate stages within a range of 0 to 3.0 sec.

As a result, film thickness has proved adjustable substantially linearly within the range of about 1.12 to 1.21 $\mu$m. Moreover, variations indicative of uniformity in film thickness are in one-digit values, which mean an excellent film thickness obtained. In the test, the idle spinning time $T_H$ was varied within the range of 0 to 3.0 sec. A further extension of the above idle spinning time $T_H$ is expected to produce a thinner film of excellent quality.

Figure 8:
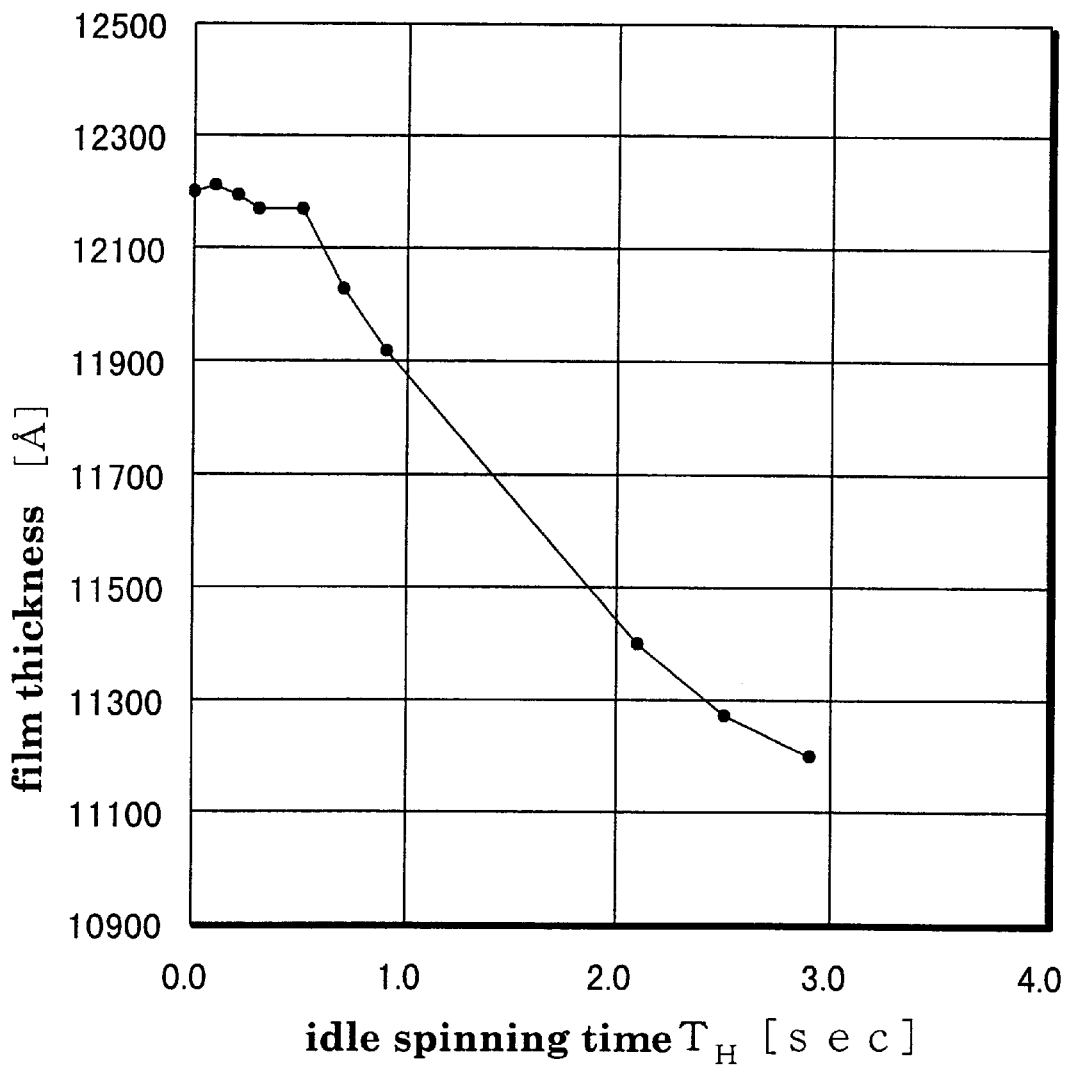
FIG. 8 is a graph showing another example of film thickness ranges resulting from variations in idle spinning time.

FIG. 8 shows measurements obtained where the (supplying) rotational frequency R3 was 1,500 rpm, (target) rotational frequency R4 was 3,500 prm, and (film-forming) rotational frequency R5 was 2,800 rpm. Further, the supply continuance time $T_{H0}$ was shortened to 0.3 sec., and the idle spinning time $T_H$ was varied in appropriate stages within the range of 0 to 3.0 sec.

As a result, film thickness has proved adjustable within the range of about 1.11 to 1.2 $\mu$m, and variations are excellent.

As for rotational frequency change starting time Ta and rotational frequency changing time Tb in the time chart of FIG. 5, the following settings are found desirable through varied experiments.

It is desirable to set the rotational frequency change starting time Ta to a period of time for the photoresist solution supplied adjacent the center of wafer W to spread under centrifugal force to cover the entire surface of wafer W. As a specific example, in the case of 8-inch wafers, the time Ta is in the range of about 0.1 to 0.6 sec. This value is variable with wafer size, (supplying) rotational frequency R3, surface conditions of wafers, and rate of the photoresist solution supplied through the supply nozzle 30. The time Ta may be set based on these conditions and to meet the above requirement.

The rotational frequency changing time Tb should desirably be short so that the fingers extending linearly from adjacent the center of the wafer toward the edge thereof be bent to a maximal degree in a circumferential direction. However, acceleration made in too short a time would cause an inconvenience that the fingers extending linearly from adjacent the center of the wafer toward the edge thereof scatter away or, even if once bent circumferentially, begin to extend straight toward the edge of the wafer again under a strong centrifugal force. Thus, the fingers would have a reduced enlargement in circumferential width, resulting in an extended coating time. Experiment has shown that a preferred rotational frequency changing time Tb is in the range of about 0.2 to 0.3 sec. which in terms of acceleration is 7,500 rpm/sec. to 50,000 rpm/sec.

Figure 9:
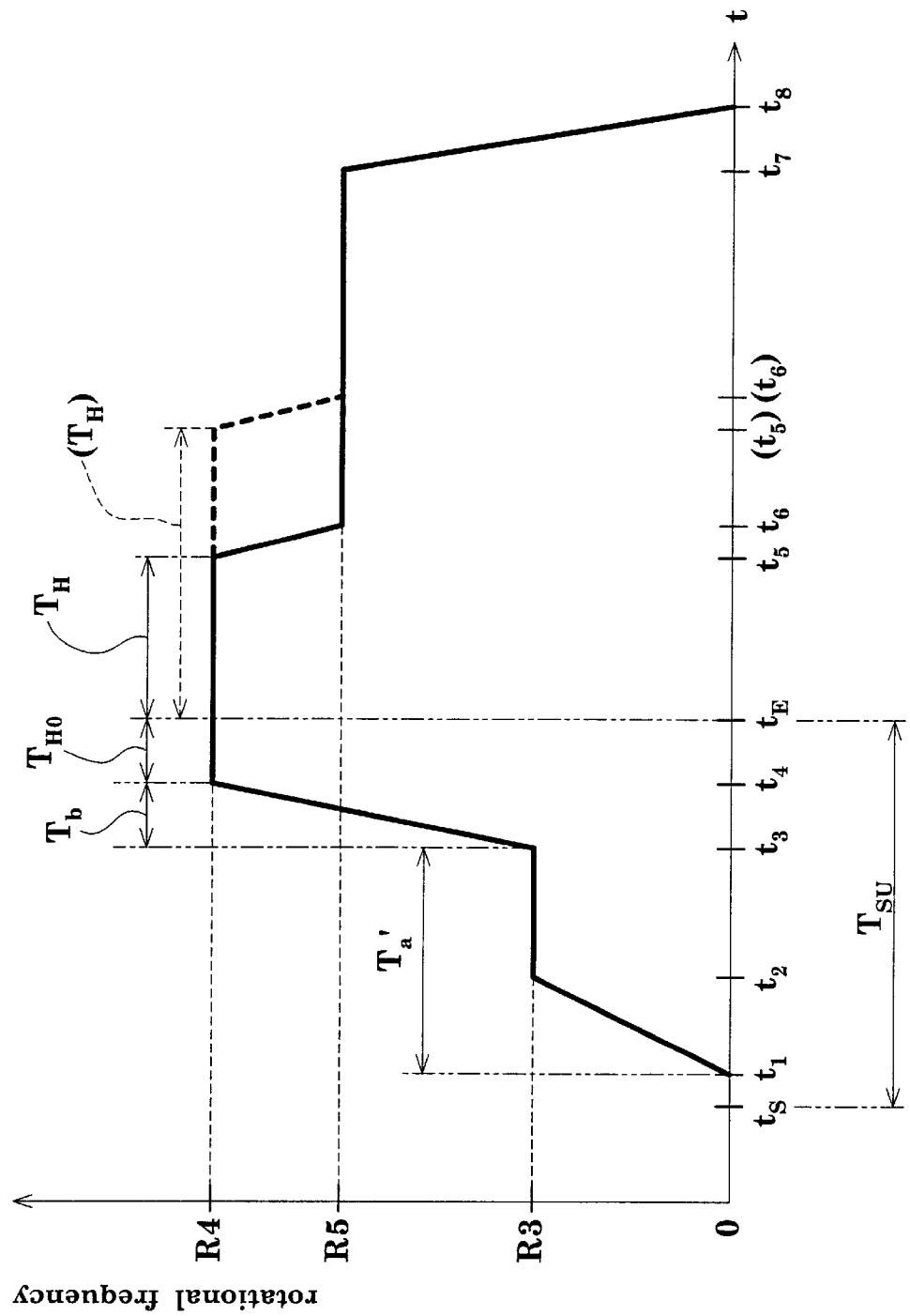
FIG. 9 is a time chart showing a photoresist applying method (stamic method) according to the present invention.

Next, a different supplying method ("stamic method") will be described with reference to the time chart shown in FIG. 9. In this method, the photoresist solution supply is started while the wafer is maintained still, and stopped after a spin of the wafer is started. The apparatus here has the same construction as shown in FIG. 4, the only difference being in the processing program stored in the memory 51.

First, at a point of time $t_S$, the photoresist solution begins to be supplied through the supply nozzle 30 to the wafer W suction-supported by the spin chuck 10, without starting the motor 12. The motor 12 is started after a predetermined time, at a point of time $t_1$, to attain a rotational frequency (i.e. supplying rotational frequency) R3 at a point of time $t_2$. When a spin is started in this way, the circular drop (core) present around the center of wafer W gradually spreads in concentric circles with a continued supply of photoresist solution and under a centrifugal force generated by the spin. Subsequently, the photoresist solution begins to flow in a plurality of rivulets (i.e. fingers) from the edge of the core toward the edge of wafer W. Before the entire surface of wafer W is covered by the photoresist solution spread by the rotational frequency R3, the spin of wafer W is accelerated (at a point of time $t_3$) from the supplying rotational frequency R3 to a higher rotational frequency R4. Consequently, as described hereinbefore, the fingers extending linearly are bent circumferentially to shorten the coating time required and to improve the use efficiency of the photoresist solution.

The period from the wafer spin starting point of time $t_1$ to the point of time $t_2$ corresponds to a rotational frequency change starting time Ta', which should preferably be set as in the "dynamic method" described hereinbefore. The period from point of time $t_3$ to point of time $t_4$ for accelerating the spin of wafer W from rotational frequency R3 to rotational frequency R4 corresponds to the rotational frequency changing time Tb. This time Tb also should preferably be set as in the "dynamic method".

The photoresist solution supply through the supply nozzle 30 is stopped at a point of time $t_E$, i.e. upon lapse of a supply continuance time $T_{H0}$ from the point of time $t_3$ at which the high-speed rotational frequency R4 is reached. As noted hereinbefore, turbulent gas flows are generated by the high-speed rotational frequency R4. However, the photoresist solution has spread substantially over the entire surface of wafer W by then, to secure a uniform film thickness. As in the foregoing "dynamic method", the quantity of photoresist solution to be dispelled is variable by adjusting the idle spinning time $T_H$ for maintaining the high-speed rotational frequency R4 with reference to the point of time $t_E$ at which the photoresist solution supply is stopped. In this way, the thickness of photoresist film may be adjusted. Moreover, with no influence of turbulent flows exerted, a photoresist film of highly uniform thickness may be formed.

The foregoing description has been made, exemplifying film thickness adjustment only through an adjustment of the idle spinning time $T_H$. Other parameters for enabling film thickness adjustment include (supplying) rotational frequency R3, (target) rotational frequency R4, (film-forming) rotational frequency R5 and periods for spinning at these frequencies. However, naturally, these rotational frequencies should be adjusted by taking into account the generation of turbulent gas flows causing non-uniform film thicknesses.

In the foregoing description, a photoresist solution has been used as one example of coating solutions. Needless to say, this invention produces the same effects where the coating solution is SOG solution or polyimide resin.

The present invention may be embodied in other specific forms without departing from the spirit or essential attributes thereof and, accordingly, reference should be made to the appended claims, rather than to the foregoing specification, as indicating the scope of the invention.

What is claimed is:

1. A method of applying a coating to a surface of a substrate to form a coating film of desired thickness thereon, said method comprising the steps of:
    (a) starting supply of said coating solution to a region centrally of said substrate while said substrate is maintained still or spun at a supplying rotational frequency;
    (b) accelerating said substrate to a target rotational frequency higher than said supplying rotational frequency before said coating solution is spread by said supplying rotational frequency to cover an entire surface of said substrate;
    (c) stopping the supply of said coating solution to said substrate; and
    (d) spinning said substrate at a film-forming rotational frequency, lower than said target rotation frequency, to form said coating film;
    wherein the period of time said substrate is spun at said target rotational frequency is varied to adjust a thickness of said coating film.

2. A method as defined in claim 1, wherein said supply is started while said substrate is spun at said supplying rotational frequency, and stopped after said substrate reaches said target rotational frequency, said substrate continuing to be spun at said target rotational frequency for an idle spinning time which is adjusted with reference to a point in time which said supply is stopped.

3. A method as defined in claim 2, wherein, when said supplying rotational frequency is 1,500 rpm, said target rotational frequency is 4,000 rpm and said film-forming rotational frequency is 3,000 rpm, a supply continuance time from attainment of said target rotational frequency to stopping of the supply of said coating solution is 0.4 sec., said idle spinning time is within a range of between 0 to 3 sec.

4. A method as defined in claim 3, wherein said substrate is accelerated to said target rotational frequency at a rate of 7,500 to 50,000 rpm/sec.

5. A method as defined in claim 2, wherein, when said supplying rotational frequency is 1,500 rpm, said target rotational frequency is 3,500 rpm and said film-forming rotational frequency is 2,800 rpm, a supply continuance time from attainment of said target rotational frequency to stopping of the supply of said coating solution is 0/3 sec., and said idle spinning tie is within a range of between 0 to 3 sec.

6. A method as defined in claim 2, wherein said substrate begins to be accelerated to said target rotational frequency approximately 0.1 to 0.6 sec. from a point in time at which said supply is started.

7. A method as defined in claim 2, wherein said substrate is accelerated to said target rotational frequency at a rate of 7,500 to 50,000 rpm/sec.

8. A method as defined in claim 1, wherein, when said supplying rotational frequency is 1,500 rpm, said target rotational frequency is 4,000 rpm and said film-forming rotational frequency is 3,000 rpm, a supply continuance time from attainment of said target rotational frequency to stopping of the supplying of said coating solution is 0.4 sec., said substrate being spun at said target rotational frequency for an idly spinning time of between 0 to 3 sec. as measured from a point of time at which said supply is stopped.

9. A method as defined in claim 3, wherein said substrate is accelerated to said target rotational frequency at a rate of 7,500 to 50,000 rpm/sec.

10. A method as defined in claim 1, wherein, when said supplying rotational frequency is 1,500 rpm, said target rotational frequency is 3,500 rpm and said film-forming rotational frequency is 2,800 rpm, a supply continuance time from attainment of said target rotational frequency to stopping of the supply of said coating solution is 0.3 sec., said substrate being spun at said target rotational frequency for an idle spinning time between 0 to 3 sec. as measured from a point of time at which said supply is stopped.

11. A method as defined in claim 1, wherein said substrate begins to be accelerated to said target rotational frequency approximately 0.1 to 0.6 sec. from a point in time at which said supply is started.

12. A method as defined in claim 1, wherein said substrate is accelerated to said target rotational frequency at a rate of 7,500 to 50,000 rpm/sec.

13. A method as defined in claim 1, wherein said supply is started while said substrate is maintained stationary, and stopped after said substrate reaches said target rotational frequency, said substrate continuing to be spun at said target rotation frequency for a time period following the point in time at which said supply is stopped, said period being determined by a human operator.

14. A method as defined in claim 13, wherein said substrate begins to be accelerated to said target rotational frequency approximately 0.1 to 0.6 sec. from a point in time at which said substrate begins to be spun with said supplying rotational frequency.

15. A method as defined in claim 14, wherein said substrate is accelerated to said target rotational frequency at a rate of 7,500 to 50,000 rpm/sec.

16. A method as defined in claim 13, wherein said substrate is accelerated to said target rotational frequency at a rate of 7,500 to 50,000 rpm/sec.

* * * * *